United States Patent

[11] 3,558,913

[72] Inventor Derek J. Hatley
Monroe County, N.Y.
[21] Appl. No. 663,607
[22] Filed Aug. 28, 1967
[45] Patented Jan. 26, 1971
[73] Assignee General Dynamics Corporation
a corporation of Delaware

[54] RAPID SWITCHING LOGIC GATES
8 Claims, 3 Drawing Figs.

[52] U.S. Cl. .......... 307/206, 307/215, 307/322, 307/323
[51] Int. Cl. .......... H03k 19/10
[50] Field of Search .......... 307/206, 215, 322, 323

[56] References Cited

UNITED STATES PATENTS

| | | | |
|---|---|---|---|
| 3,031,584 | 4/1962 | Henle | 307/215 |
| 3,032,664 | 5/1962 | Rowe | 307/215 |
| 3,054,911 | 9/1962 | Buelow | 307/206 |
| 3,090,926 | 5/1963 | Engel | 307/206 |
| 3,235,754 | 2/1966 | Buelow II | 307/206 |
| 3,260,841 | 7/1966 | Hayden | 307/206 |
| 3,253,165 | 5/1966 | Cornish | 307/206 |

OTHER REFERENCES

LOGIC CIRCUIT by Henle and Murphy IBM Technical Disclosure, Vol 7 No. 11 April 1965 p. 1094

*Primary Examiner*—Donald D. Forrer
*Assistant Examiner*—Harold A. Dixson
*Attorney*—Martin Lu Kacher

ABSTRACT: A logic gate is described in which a transistor may be switched both on and off at extremely high speeds. The gate includes at least two pairs of elements, with each pair consisting of a negative resistance device and a matching resistor. The first pair is connected in the collector circuit and the second pair is connected in the emitter circuit of the transistor.

INVENTOR.
DEREK J. HATLEY

BY Raymond L. Owens ATTY

RAPID SWITCHING LOGIC GATES

The present invention relates to logic gates which employ the advantageous characteristics of negative resistance devices.

In the past, logic designers have sometimes based whole sets or families of logic gates on a single simple element, generally a NAND or NOR gate. Complex logic functions can be performed by such gates. Moreover, such gates have the advantage of simplicity of both electronic and logical design, and they avoid the problems of impedance and voltage matching which commonly occur in systems having multiple element types. The requirements of such a gate are that: it should have power gain, i.e., must be capable of a fan-out to at least two other elements; its voltage or current gain must be at least unity when fully loaded; it must logically combine at least two signals; and, to be logically universal it must involve some form of signal inversion.

As logic techniques and programming theories advance, it becomes increasingly important to develop logic gates which may switch at increasingly higher speeds. In many applications, transistors are used to provide the switching elements. The transistor, when used as a logic switch, suffers from switching speed limitations. Although attempts have been made to reduce the turn-on and turn-off delays, presently available circuits still have difficulties, especially when switching from an on to an off condition.

Accordingly, it is an object of the present invention to provide an improved basic logic gate which may be switched on and off at extremely high speeds and which has the above-indicated characteristics.

Briefly described, a logic gate in accordance with the present invention includes a transistor, which operates in the nonsaturation mode, having base, emitter, and collector electrodes and two pairs of elements, with each pair including a negative resistance device and a fixed resistance element connected in parallel therewith. The fixed resistance element desirably has a value of resistance equal in magnitude to the value of resistance of its parallel negative resistance device. This causes the pair to exhibit a region of approximately constant current. The first pair is disposed in the emitter circuit and connected to ground and the second pair is connected in the collector circuit. By means of this arrangement the transistor is easily switched from conductive to nonconductive states and vice versa. Moreover, by paralleling several logic gates and tying their collector circuits in common, additional logic functions may be accomplished.

A gate in accordance with the invention achieves high speed with low dissipation by using grounded emitter transistors in the nonsaturating mode. By using fast switching devices in conjunction with the above configuration, switching speeds are enhanced.

It is an important feature of the invention to provide gates which operate transistors in the nonsaturating modes, thereby avoiding the inherently slower switching speeds which characterize transistors when they switch into and out of the saturation region.

Another important feature of the invention is its adaptability to be constructed in integrated circuit form, particularly as a thin film or hybrid-type integrated circuit.

The invention itself, both as to its organization and method of operation, as well as additional objects and advantages thereof will become more readily apparent from a reading of the following description taken in connection with the accompanying drawings in which.

Figure 1:
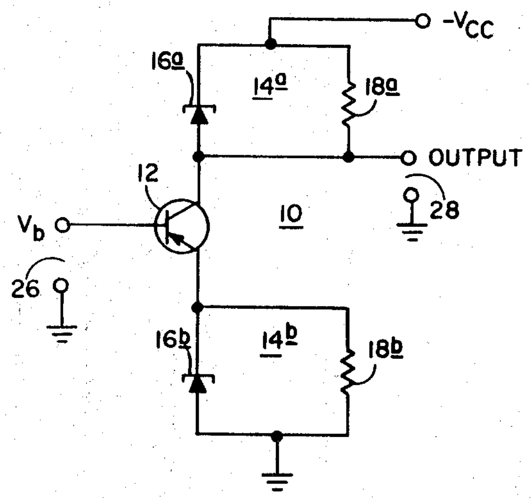
FIG. 1 is a schematic circuit diagram of a logic gate in accordance with the invention.

Referring to FIG. 1, there is shown a single input logic gate 10 in accordance with the present invention which includes a PNP transistor 12 having base, emitter and collector electrodes, and two pairs of elements 14*a* and 14*b* with each pair having a negative resistance device in the form of a tunnel diode 16 and a resistor 18 whose value is approximately equal to the magnitude of the negative slope resistance of the tunnel diode connected in parallel therewith. Each pair thus exhibits a constant current region in its I—V characteristic. The first pair 14*a* is connected into the collector circuit between the collector and a source of voltage $-V_{cc}$, and the second pair 14*b* is disposed in the emitter circuit and connected between the emitter and ground. With zero (ground) base voltage $V_b$ applied to the ungrounded one of the terminals 26, a negative output voltage appears at the ungrounded one of the output terminals 28. This output voltage is taken at the collector of the transitor 12. A negative output voltage (with respect to ground) may represent, for example, a binary zero. When a negative voltage step $V_b$ is applied to the ungrounded terminal 26, such that the pair of elements 14*b* in the emitter circuit is driven into the constant current region, the transitor 12 will rapidly be switched to a conductive state and a more positive voltage will appear at the terminal 28 which may be used to represent a binary one. The step voltage $V_b$ is not critical due to the constant current characteristic of the emitter circuit. Similarly, if the input voltage $V_b$ is switched off, then the transistor will again switch to a nonconductive state. The gate of FIG. 1 may be used as an inverter, cross-coupled with another like gate to provide a flip-flop. The gate may also be provided with multiple diode inputs across a common base resistor to provide a multiinput NAND function.

Figures 2, 3:
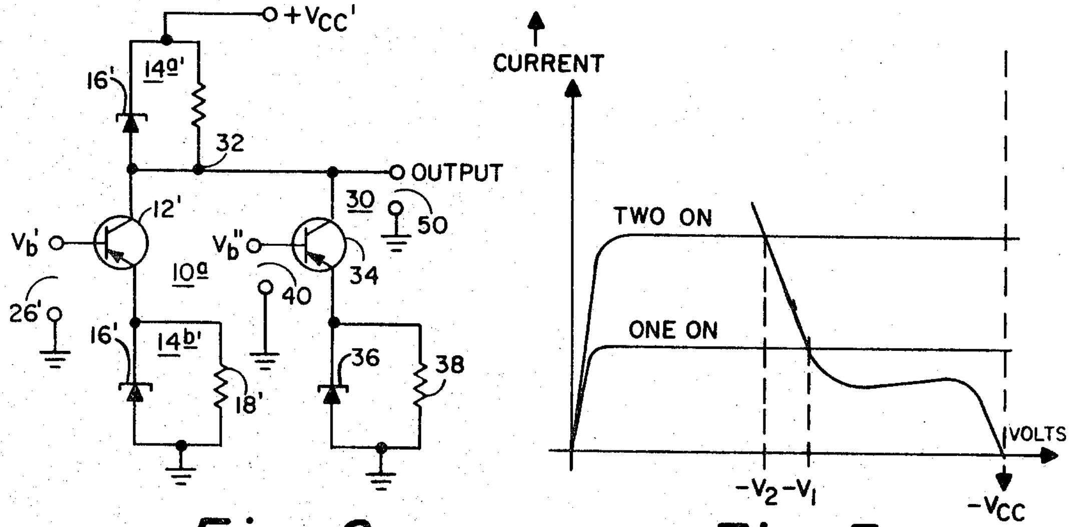
FIG. 2 is a schematic circuit diagram of another logic gate in accordance with the invention.
FIG. 3 is a characteristic curve of current versus voltage for the logic gate of FIG. 2.

In the logic gate shown in FIG. 2, two circuits 10*a* and 30 are connected with their collectors tied in common. The first circuit 10*a* is the logic gate as described in FIG. 1 and so its elements have been designated by primed numerals. The second logic circuit 30 is connected to the circuit 10*a* at a junction 32 so that both circuits 10*a* and 30 share the first pair 14*a'* and the source of voltage $-V_{cc}$. The circuit 30 includes a PNP transitor 34 and a pair of elements including a tunnel diode 36 and a resistor 38 which are connected in parallel and disposed in the emitter circuit of the transistor 34. A gating voltage $V_b''$ is applied to the ungrounded base terminal 40 of the circuit 30. The output for both circuit 10*a* and 30 is taken from the terminal 50.

When either input voltage $V_b'$ or $V_b''$ is applied, (but not both $V_b'$ and $V_b''$), one of the transistors 12 or 34 will be gated on and the output voltage seen at the terminal 50 is $-V_1$. (See FIG. 3) $V_b'$ and $V_b''$ are negative voltage steps as mentioned above. When both input voltages are applied, the output voltage $-V_2$ appears at the ungrounded terminal 50. Thus by means of this arrangement two circuits may be tied together to form a gate, and the output voltage with either one or both circuits on is approximately the same. Of course when no base voltage is applied to either transistor then the output voltage will be approximately equal to the supply voltage 31 $V_{CC}$. The logic gate is especially adapted to perform multiinput NOR functions.

In accordance with the invention a logic gate employs a nonsaturating transistor in which nonlinear feedback is achieved by the provision of a tunnel diode and resistor in its emitter circuit. By virtue of the tunnel diode and resistor in the collector, the collector voltage will not rise to a level where the transistor saturates even though a large input voltage is supplied to the base. With the configuration as shown in FIG. 2, each additional transistor (viz., 34) will attempt to pass greatly increased current through the collector circuit. If this happened, the output voltage would drop and the transistor would saturate. This tendency is prevented by using the tunnel diode-resistor pair in the collector circuit. Accordingly, when two or more gates are connected in parallel as in FIG. 2, the current change will produce only a small change in output voltage. The tunnel diode characteristic increases the switch-off speed due to the additional current it provides to charge circuit and stray capacitances.

While various embodiments of the invention have been described, variations thereof and modifications therein within the spirit of the invention will undoubtedly suggest themselves to those skilled in the art. For example, it will be understood that in addition to the illustrated tunnel diode, other types of negative type resistance devices may also be employed in accordance with the present invention. Moreover, rather than the illustrated PNP transistors, NPN transistors could also have been employed merely by changing the polarity of the applied voltages. Accordingly, the foregoing descriptions should be taken as illustrative and not in any limiting sense.

I claim:

1. A high-speed switching logic gate comprising a first circuit including:

a. a first transistor which operates in the nonsaturating mode having base, emitter and collector circuit;

b. first and second pairs of elements, with each pair having a negative resistance device and a resistance element connected in parallel, said elements operating in their constant current region;

c. said first and second pairs being respectively connected to said emitter and collector and one of said first and second pairs being electrically connected to a source of voltage and the other of said first and second pairs being connected to ground; and d. said first transistor being adapted to switch to an on condition and to an off condition in response to the respective presence and absence of a gating voltage applied to said base circuit.

2. The invention as set forth in claim 1 wherein said negative resistance devices are tunnel diodes and said matching resistance elements are resistors.

3. The invention as set forth in claim 2 wherein said transistor is of a PNP variety.

4. The invention as set forth in claim 1 wherein each resistor has a value of resistance which is approximately equal in magnitude to the negative slope resistance of the device connected in parallel therewith.

5. The invention as set forth in claim 1 including a second circuit combined with said first circuit to form a logic gate, said circuit comprising:

e. a second transistor which operates in the nonsaturating mode having base and emitter circuits with said second collector tied to the first collector circuit;

f. a third pair of elements having a negative resistance device and a matching resistance element connected in parallel, said third pair being disposed in said second emitter circuit; and g. said second transistor being adapted to switch to an on condition and to an off condition in response to the respective presence and absence of a gating voltage applied to said base circuit.

6. The invention as set forth in claim 5 wherein said negative resistance devices are tunnel diodes and said third matching resistance element is a resistor.

7. The invention as set forth in claim 6 wherein said first and second transistors are of a PNP variety.

8. The invention as set forth in claim 5 wherein each resistor has a value which is approximately equal in magnitude to the negative slope resistance of the tunnel diode connected in parallel therewith.